United States Patent [19]

Nishihara et al.

[11] Patent Number: 4,755,756
[45] Date of Patent: Jul. 5, 1988

[54] RADIO FREQUENCY COIL FOR NUCLEAR MAGNETIC RESONANCE IMAGING

[75] Inventors: Susumu Nishihara; Kiyoshi Yoda, both of Amagasaki, Japan

[73] Assignee: Mitsubishi Denki Kabushiki Kaisha, Tokyo, Japan

[21] Appl. No.: 13,901

[22] Filed: Feb. 12, 1987

[30] Foreign Application Priority Data

| Feb. 18, 1986 | [JP] | Japan | 61-31968 |
| Feb. 18, 1986 | [JP] | Japan | 61-31969 |
| Feb. 25, 1986 | [JP] | Japan | 61-38207 |
| Mar. 10, 1986 | [JP] | Japan | 61-51936 |
| Mar. 11, 1986 | [JP] | Japan | 61-55461 |
| Jul. 29, 1986 | [JP] | Japan | 61-179526 |
| Jul. 29, 1986 | [JP] | Japan | 61-179527 |
| Aug. 26, 1986 | [JP] | Japan | 61-200552 |

[51] Int. Cl.$^4$ .................................................. G01R 33/20
[52] U.S. Cl. ................................... 324/322; 333/219
[58] Field of Search ........... 324/61 QS, 61 QL, 57 Q, 324/300, 307, 309, 311, 313, 314, 315, 316, 318, 322; 128/653; 333/219, 222

[56] References Cited

U.S. PATENT DOCUMENTS

| 4,633,181 | 12/1986 | Murphy et al. | 324/318 |
| 4,634,980 | 1/1987 | Misic et al. | 324/322 |
| 4,641,097 | 2/1987 | Bottomley | 324/322 |

FOREIGN PATENT DOCUMENTS 0160942 11/1985 European Pat. Off. .
61-95234 5/1986 Japan .

OTHER PUBLICATIONS

"An Efficient Decoupler Coil Design Which Reduces Heating in Conductive Samples in Superconducting Spectrometers", *Journal of Magnetic Resonance*, vol. 36, pp. 447-451, 1979.

*Primary Examiner*—Michael J. Tokar
*Attorney, Agent, or Firm*—Oblon, Fisher, Spivak, McClelland & Maier

[57] ABSTRACT

A radio frequency coil for nuclear magnetic resonance imaging comprises at least one pair of arcuate H-shaped members which are disposed about a longitudinal axis so as to form a tube. A variable capacitor means for adjusting the resonant frequency of the coil is connected across the feeding points of the coil. A balanced feed circuit comprising a balanced impedance matching circuit and a balanced-to-unbalanced converter is connected across the feeding points. An unbalanced current from a transceiver is converted into balanced currents which are fed to the feeding points.

21 Claims, 5 Drawing Sheets

RADIO FREQUENCY COIL FOR NUCLEAR MAGNETIC RESONANCE IMAGING

BACKGROUND OF THE INVENTION

This invention relates to a radio frequency coil, and more particularly to an adjustable radio frequency coil for use in a nuclear magnetic resonance imaging apparatus for medical diagnosis.

A radio frequency coil for nuclear magnetic resonance imaging is in effect a radio frequency antenna which is used to generate a radio frequency magnetic field for exciting the nuclei in a sample, as well as to receive the radio frequency signals which are emitted by the excited nuclei. FIG. 1 illustrates a conventional radio frequency coil of the type described in the Journal of Magnetic Resonance, Volume 36, pages 447–451 (1979). The illustrated coil comprises a pair of H-shaped members 1 which are made of plates of an electrically conducting material such as copper. The H-shaped members 1 are symmetrically disposed about a longitudinal axis so as to form a hollow, cylindrical tube. Each H-shaped member 1 has a longitudinally-extending web 1a, which is referred to as a vertical band, and two laterally-extending flanges 1b at opposite end of the web 1a, the flanges 1b being referred to as wings. Adjacent flanges 1b are electrically connected with one another by means of chip capacitors 2. Two electrically conducting guard rings 3a and 3b, at least one of which is grounded, are coaxially disposed within the tube at its opposite ends. The guard rings are separated from the inner surface of the H-shaped members 1 by a layer of an electrically insulating material such as Teflon. The guard rings shield a sample from the electric fields which are generated by the radio frequency voltage present between the wings and decrease dielectric losses within a sample. Two electrodes 4a and 4b are integrally formed on one of the H-shaped members 1 and on the bottom guard ring 3b, respectively. The electrode 4a which is formed on one of the H-shaped members 1 is connected to the hot electrode of a terminal 6 through a first impedance-matching variable capacitor 5a, while the other electrode 4b which is formed on the bottom guard ring 3b is directly connected to the ground electrode of the terminal 6. A second impedance-matching variable capacitor 5b is connected across the two electrodes of the terminal 6. The terminal 6 is connected via an unillustrated coaxial cable to an unillustrated radio frequency transceiver which is used to excite the coil and to receive the signals which the coil picks up from a sample.

The H-shaped members 1, the chip capacitors 2, and the guard rings 3a and 3b together form a three-dimensional circuit which is equivalent to a series resonant circuit, the resonant frequency of which can be adjusted by the variable capacitors 5a and 5b.

This conventional radio frequency coil has the drawback that no consideration is given to the balance of the currents which are fed to the electrodes 4a and 4b. Namely, in-phase currents are supplied to the terminal 6 and thus to the electrodes 4a and 4b via the coaxial cable, with the result that the operation of the coil is unstable, its value of Q is relatively low, and its sensitivity of reception is poor.

SUMMARY OF THE INVENTION

It is an object of the present invention to provide a radio frequency coil for nuclear magnetic resonance imaging which overcomes the above-mentioned drawbacks of conventional radio frequency coils and has good stability, a high value of Q, and good sensitivity in reception.

In a radio frequency coil according to the present invention, this object is achieved by the provision of a balanced feed circuit which feeds balanced currents to the coil. Since the feed currents are balanced with respect to ground, the electric power which is supplied to the coil is maximized, the stability and sensitivity are improved, and the Q of the coil is increased.

A radio frequency coil according to the present invention comprises one or more pairs of plate-like, electrically conducting H-shaped members each having a longitudinally-extending web and two flange portions at opposite ends of the web. The H-shaped members are each bent into the shape of an arc and symmetrically disposed about a common axis so as to form a tube. The flanges extend circumferentially around the tube towards one another, and the flanges of adjacent H-shaped members are electrically connected with one another. A variable capacitor means for adjusting the resonant frequency of the coil and a balanced feed circuit for feeding balanced currents to the coil are provided. The balanced feed circuit comprises a balanced impedance matching circuit and a balanced-to-unbalanced converter.

In a preferred embodiment, the balanced feed circuit comprises the variable capacitor means and two variable capacitors which each have one end connected to an end of the variable capacitor means, and the balanced-to-unbalanced converter comprises a half-wavelength coaxial cable which is connected between the ends of the variable capacitors.

In one form of the present invention, the variable capacitor means is a conventional variable capacitor which is connected between two flanges of adjacent H-shaped members of the coil. In another form of the invention, at least one of the H-shaped members of each pair of H-shaped members is divided transversely in two at its midportion to form two T-shaped plates, and the variable capacitor means is a conventional variable capacitor which is connected between the legs of the two T-shaped plates. In yet another form of the invention, each of the H-shaped members is divided transversely in two at its midportion so as to form two T-shaped plates, thereby dividing the coil into two halves. The legs of the T-shaped plates overlap one another in the longitudinal direction of the coil, and the two halves of the coil are supported so that at least one half can be moved in the longitudinal direction with respect to the other half. The variable capacitor means comprises the overlapping portions of the legs of the T-shaped plates and a dielectric material which is disposed between the legs in the overlapping portions.

BRIEF DESCRIPTION OF THE DRAWINGS

In the drawings, the same reference numerals indicate the same or corresponding parts.

DESCRIPTION OF THE PREFERRED EMBODIMENTS

Figure 1:
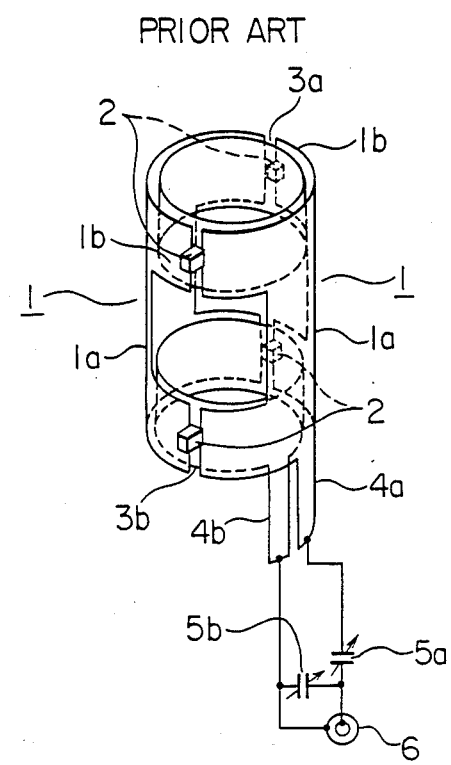
FIG. 1 is a schematic perspective view of a conventional radio frequency coil for nuclear magnetic resonance imaging.
Figure 2:
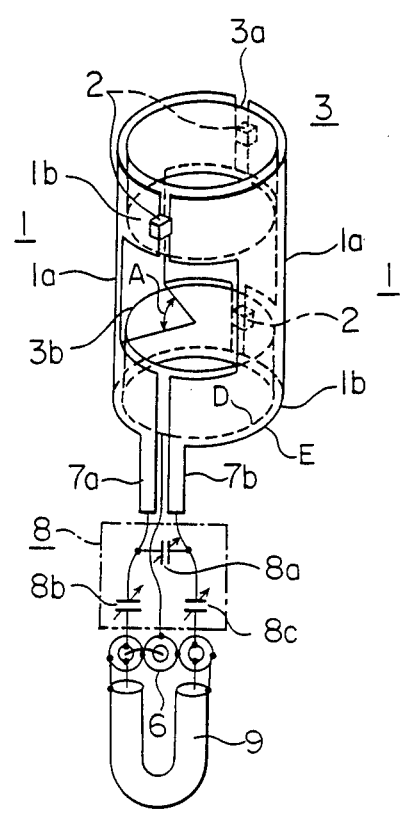
FIG. 2 is a schematic perspective view of a first embodiment of a radio frequency coil according to the present invention.
Figure 3:
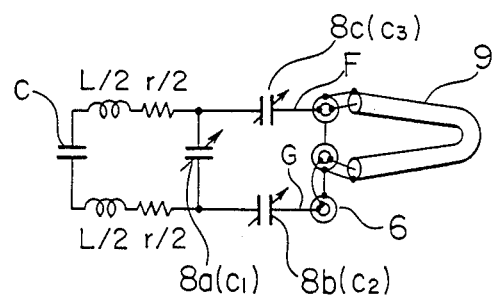
FIG. 3 is an equivalent circuit diagram of the embodiment of FIG. 2.

Hereinbelow, a number of preferred embodiments of a radio frequency coil according to the present invention will be described while referring to the accompanying drawings, of which FIG. 2 and FIG. 3 illustrate a first embodiment. Like the conventional radio frequency coil shown in FIG. 1, this first embodiment of a radio frequency coil has a pair of arcuate, plate-like H-shaped members 1 which are symmetrically disposed about a longitudinal axis so as to form a cylindrical tube. The H-shaped members 1 are made of plates of an electrically conducting material such as copper. Each of the H-shaped members 1 has a longitudinally-extending web 1a and two flanges 1b at its opposite ends which are perpendicular to the webs 1a. The flanges 1b extend circumferentially around the tube towards one another with a gap left between the confronting ends. The ends of the upper flanges 1b are each electrically connected to the confronting flange 1b of the other H-shaped member 1 by a fixed capacitor in the form of a chip capacitor 2, and one pair of confronting ends of the bottom flanges 1b are also connected together by a chip capacitor 2. The angle A of the arc spanned by each of the webs 1a measured from the longitudinal axis of the tube is preferably from 70 to 100 degrees, and more preferably is from 80 to 90 degrees. A top guard ring 3a and a bottom guard ring 3b, both made of an electrically conducting material, are coaxially disposed inside the tube at the ends thereof. The guard rings are separated from the inner surface of the H-shaped members 1 by an unillustrated layer of an electrically insulating material.

Two electrodes 7a and 7b which serve as feeding points are formed on the two confronting ends of the lower flanges 1b which are not connected by a chip capacitor 2. The two electrodes 7a and 7b are electrically connected with one another by a first variable capacitor 8a which serves as a variable capacitor means for adjusting the resonant frequency of the coil. A second variable capacitor 8b and a third variable capacitor 8c are connected in parallel to opposite ends of the first variable capacitor 8a. The three variable capacitors 8a–8c together constitute a balanced impedance matching circuit 8 for matching the impedance of the coil with that of an unillustrated transceiver. The ends of the second and third variable capacitors 8b and 8c which are not connected to the first variable capacitor 8a are connected to one another by the inner conductor of a half-wavelength coaxial cable 9, which serves as a balanced-to-unbalanced converter. Both ends of the outer conductor of the coaxial cable 9 are connected to the ground electrode of a terminal 6 which is connected to the unillustrated transceiver by an unillustrated coaxial cable. The end of the second variable capacitor 8b which is connected to the coaxial cable 9 is also connected to the hot electrode of the terminal 6. The bottom guard ring 3b is connected to the ground electrode of the terminal 6 by a ground wire. The balanced impedance matching circuit 8 and the coaxial cable 9 together constitute a balanced feed circuit for feeding balanced currents to the electrodes 7a and 7b.

FIG. 3 illustrates an equivalent circuit of the embodiment of FIG. 2. The inductances L/2 represent the distributed inductances of the webs 1a of each of the H-shaped members 1, and the resistance r is the distributed resistance of the H-shaped members 1. The capacitance C represents the total capacitance of the chip capacitors 2, while C1, C2, and C3 are the respective capacitances of the first, second, and third variable capacitors 8a–8c. The first variable capacitor 8a and the 3-dimensional circuit formed by the H-shaped members 1, the chip capacitors 2, and the guard rings 3a and 3b form an equivalent series-parallel resonant circuit, the resonant frequency of which can be adjusted by adjusting the variable capacitor 8a.

During the operation of the present invention, unbalanced feed current is supplied to the terminal 6 from the unillustrated transceiver. A portion of the feed current is supplied directly to electrode 7a, and the remainder passes through the half-wavelength coaxial cable 9 before being fed to electrode 7b. The half-wavelength coaxial cable 9 produces a phase lag of 180 degrees in the current passing through it so that the current which is fed to electrode 7b is of the same magnitude as the current fed to electrode 7a but of opposite phase. In other words, the two currents are balanced with respect to ground. As a result, maximum electrical power can be supplied to the coil and the feeding efficiency and the stability of operation are increased. In addition, signals from a sample disposed inside the coil can be detected with high efficiency.

By suitably adjusting the three variable capacitors 8a–8c, it is possible to perform exact impedance matching for any resonant frequency. For example, suppose that it is desired that the coil have a balanced input impedance of 200 ohms as viewed from points F and G in FIG. 3, and that the resonant frequency of the coil be a given frequency $\omega$. These conditions can be satisfied by adjusting the capacitances C1–C3 of the three variable capacitors 8a–8c so as to have the following values, wherein C, L, and R are as defined earlier with respect to FIG. 3.

$$C_1 = \frac{1 - \sqrt{\frac{R}{200}}}{\omega^2 L - \frac{1}{C}}$$

$$C_2 = C_3 = \frac{2\sqrt{\frac{R}{200}}}{\omega^2 L - \frac{1}{C}}$$

If the coaxial cable 9 has a 4:1 impedance converting effect, then as viewed from the terminal 6, the coil has an unbalanced impedance of 50 ohms. As a transceiver for a radio frequency coil and the coaxial cable which connects the transceiver to a terminal commonly have an unbalanced impedance of 50 ohms, the impedance matching provided by the balanced feed circuit is exact and highly efficient signal transmission is possible. For example, in an experiment at 42 MHz, a very high value for Q of 500 was obtained.

Instead of connecting the balanced feed circuit of FIG. 2 between two feeding point on confronting flanges 1b, it is also possible to connect the balanced feed circuit between a guard ring and one of the flanges 1b surrounding the guard ring, such as point D on the bottom guard ring 3b and point E on one of the lower flanges 1b of FIG. 2. In such a case, all the pairs of confronting flanges would be electrically connected, as in FIG. 1. A coil having such a structure operates in the same manner as the coil of FIG. 2.

Figure 4:
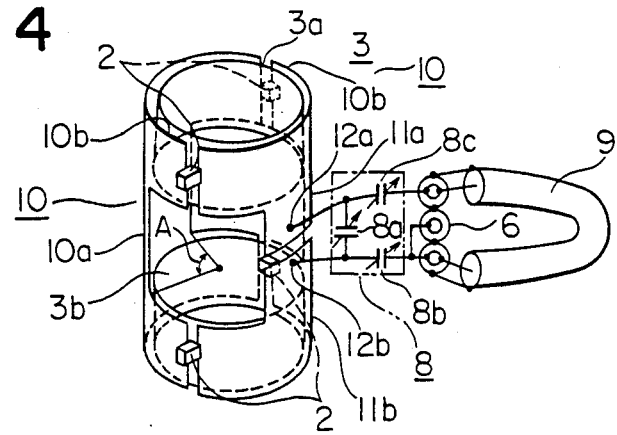
FIG. 4 is a schematic perspective view of a second embodiment of the present invention in which one of the H-shaped members is divided in two.

FIG. 4 illustrates a second embodiment of the present invention in which the location of the feeding points is different from in the first embodiment. The overall structure is similar to that of the first embodiment. A pair of H-shaped members 10 each having a web 10a and two flanges 10b at opposite ends thereof are symmetrically disposed about an axis so as to form a hollow tube. Each of the flanges 10b is connected to a flange 10b of the adjoining H-shaped member 10 by a chip capacitor 2. The angle A of the arc spanned by each of the webs 10a as measured from the longitudinal axis of the tube is preferably 70–100 degrees and more preferably is 80–90 degrees. The flanges 10b surround two guard rings 3a and 3b which are coaxially disposed inside the tube and separated from the inner surface of the tube by electrical insulation. At least one of the guard rings is grounded.

In contrast to the H-shaped members 1 of FIG. 2, one of the H-shaped members 10 of this embodiment is divided transversely in two at the midportion of its web 10a so as to form two T-shaped plates 11a and 11b. The legs of the T-shaped plates, which correspond to the two halves of the web 10a, are separated by a prescribed gap and are electrically connected with one another by a variable capacitor means in the form of a first variable capacitor 8a. The points on the legs to which the first variable capacitor 8a is connected serve as feeding points 12a and 12b. As in the first embodiment, the first variable capacitor 8a forms an impedance matching circuit 8 together with a second variable capacitor 8b and a third variable capacitor 8c, and the impedance matching circuit 8 is connected to a half-wavelength coaxial cable 9 which serves as a balanced-to-unbalanced converter.

The operation of this embodiment is basically the same as that of the previous embodiment. Unbalanced current from a transceiver is converted by the balanced feed circuit into balanced currents which are fed to the feeding points 12a and 12b, and the same benefits as in the previous embodiment are obtained.

Figure 5:
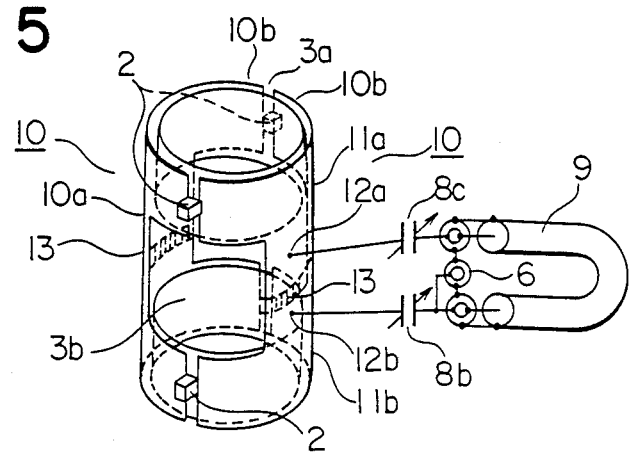
FIG. 5 is a schematic perspective view of a third embodiment of the present invention employing a different form of variable capacitor means.
Figure 6:
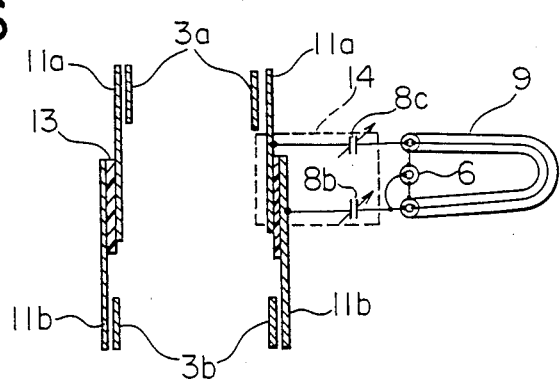
FIG. 6 is a vertical cross-sectional view of the embodiment of FIG. 5.

In the two previous embodiments, the variable capacitor means for adjusting the resonant frequency of the radio frequency coil is a conventional variable capacitor 8a. FIG. 5 illustrates a third embodiment of the present invention in which the variable capacitor means has a different form. Like the previous embodiment, this embodiment comprises two H-shaped members 10 whose flanges 10b are connected with one another by chip capacitors 2, and a pair of electrically conducting guard rings 3a and 3b which are coaxially disposed inside the cylindrical tube formed by the H-shaped members 10 and are electrically insulated therefrom. However, in this embodiment, both of the H-shaped members 10 are transversely divided in two at the midportions of their webs 10a so as to each form two T-shaped plates 11a and 11b, thereby transversely dividing the coil into an upper half and a lower half. As shown in FIG. 6, which is a schematic vertical cross-sectional view of this embodiment, the legs of the T-shaped plates 11a and 11b overlap one another in the longitudinal direction of the tube. The upper and lower halves of the coil are supported by suitable means such that at least one half of the coil (including the T-shaped plates and the guard ring forming that half of the coil) can be moved longitudinally with respect to the other half of the coil, thereby varying the height of the overlapping portions. A dielectric material 13 having the shape of an arcuate strip is disposed between the overlapping portions of the legs, the length of the dielectric material 13 in the circumferential direction being substantially equal to the width of the legs of the T-shaped plates. Examples of a suitable material for the dielectric material 13 are porcelain and a synthetic resin such as polytetrafluorethylene. In FIG. 6, the dielectric material 13 is secured to the inner surface of the lower T-shaped plates 11b and is in sliding contact with the outer surface of the upper T-shaped plates 11a, but it can instead be secured to the outer surface of the upper T-shaped plates 11a and slide against the lower T-shaped plates 11b. Furthermore, the lower T-shaped plates 11b can be disposed either on the outside of the upper T-shaped plates 11a (as illustrated) or on the inside thereof. The overlapping portions of the legs of the T-shaped plates 11a and 11b and the dielectric material 13 together constitute variable capacitor means. The capacitance of this variable capacitor means can be changed by moving one or both halves of the coil in the longitudinal direction of the coil so that there is relative motion between the two halves. This relative motion changes the area of the overlapping portions and the capacitance of the variable capacitance means. By thus varying the capacitance, the resonant frequency of the coil can be continuously varied.

Figure 7:
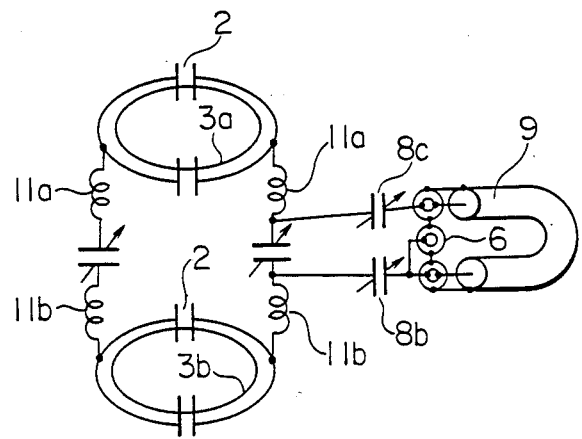
FIG. 7 is an equivalent circuit diagram of the embodiment of FIG. 5.

Two variable capacitor 8b and 8c each have one end connected to feeding points 12a and 12b on the legs of the T-shaped plates 11a and 11b, respectively. The variable capacitor means and the two variable capacitors 8b and 8c together form a balanced impedance matching circuit 14 corresponding to the impedance matching circuit 8 of the previous embodiments. The impedance matching circuit 14 is connected to a terminal 6 and a half-wavelength coaxial cable 9 in the same manner as in the previous embodiments. The impedance matching circuit 14 and the coaxial cable 9 together constitute a balanced feed circuit which functions in the same manner as the balanced feed circuit of FIG. 2. FIG. 7 is an equivalent circuit diagram of this embodiment. Although not illustrated, it is possible to in addition connect a fixed or variable capacitor for the purpose of impedance matching across the feeding points 12a and 12b.

Figure 8:
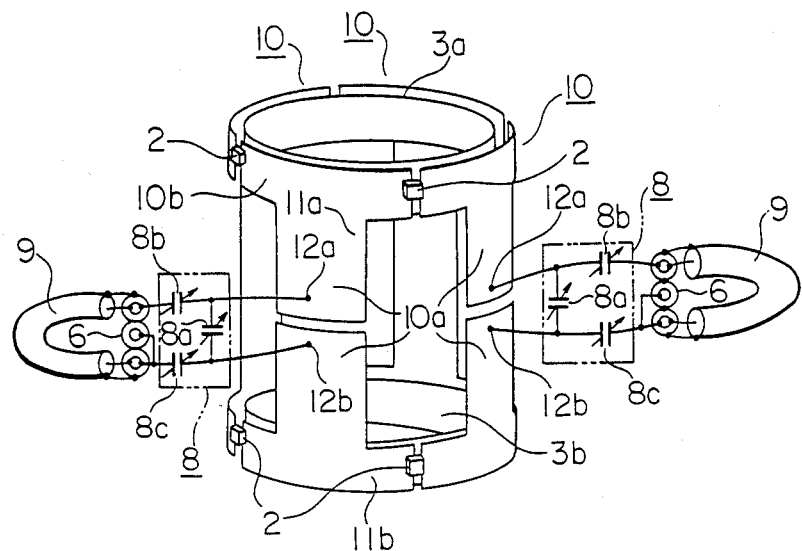
FIG. 8 is a schematic perspective view of a fourth embodiment of the present invention employing two pairs of H-shaped members.

Each of the previous embodiments of a radio frequency coil employs only a single pair of H-shaped members, but it is possible to use a larger number. FIG. 8 illustrates a fourth embodiment of the present invention employing two pairs of H-shaped members 10 which are symmetrically disposed about a common axis to form a cylindrical tube. Each of the flanges 10b of the H-shaped members 10 is electrically connected to a flange 10b of the adjoining H-shaped member 10 by a chip capacitor 2. Two guard rings 3a and 3b, at least one of which is grounded, are coaxially disposed inside the coil and are electrically insulated from the inner surface thereof. One of the H-shaped members 10 of each pair is divided in two at its midportion to form two T-shaped plates 11a and 11b, and the legs of the T-shaped plates are connected to a balanced feed circuit comprising an impedance matching circuit 8 and a half-wavelength coaxial cable 9 in the same manner as in the embodiment of FIG. 4. The operation of this embodiment is identical to that of the embodiment of FIG. 4.

When the coil comprises more than one pair of H-shaped members 10 as in FIG. 8, it is not necessary that a balanced feed circuit be connected to each pair. For example, of the two pairs of T-shaped plates in FIG. 8, the legs of one pair could be connected to a balanced feed circuit while the legs of the other pair of T-shaped plates could be connected with one another by a variable capacitor for adjusting the resonant frequency of the coil.

However, when there are a large number of H-shaped members 10 or the structure of the coil is complicated, it may be desirable to feed current via a plurality of pairs of feeding points, as in FIG. 8, in order to feed as uniformly as possible. Also when the electrical power to be supplied to the coil is very large, feeding via a plurality of pairs of feeding points enables the current to be divided into small quantities. Furthermore, if two balanced feed circuits are employed as in FIG. 8 and the current supplied to one of the terminals 6 from a transceiver is 90 degrees out of phase with respect to the current supplied to the other terminal 6, a rotating magnetic field can be produced.

The embodiment of FIG. 8 is basically an adaption of the embodiment of FIG. 4, but a coil having the same basic structure as the embodiments of FIG. 2 or FIG. 5 can also be adapted so as to have more than one pair of H-shaped members.

Figure 9:
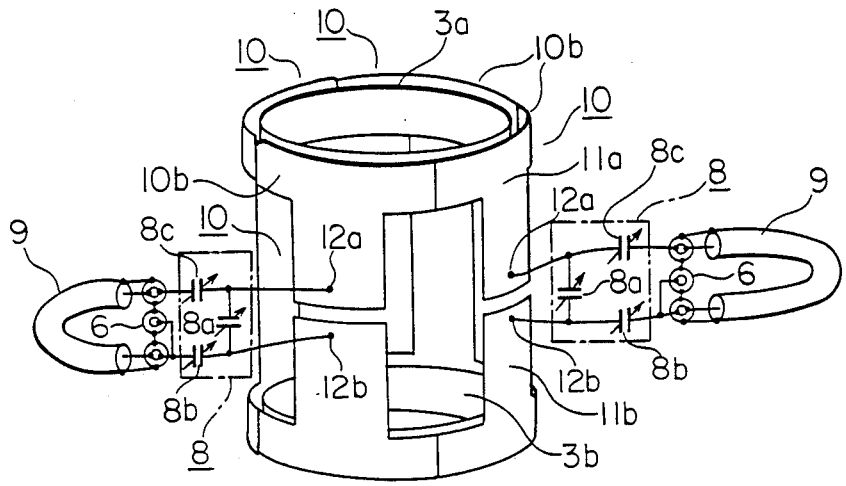
FIG. 9 is a schematic perspective view of a fifth embodiment of the present invention in which the flanges of adjacent H-shaped members are directly connected with one another.

In the previous embodiments, the flanges of adjacent H-shaped members are connected by capacitive coupling, but it is also possible for the flanges to be connected with one another by conductive coupling. FIG. 9 shows a fifth embodiment of the present invention which is identical to the embodiment of Figure 8 except that instead of the flanges 10b of the H-shaped members 10 being connected by chip capacitors 2, they are directly connected with one another by pressure welding or soldering so as to form a good electrical connection therebetween. Alternatively, it is possible to connect the flanges 10b by electrical conductors such as wires. The operation of this embodiment is the same as that of the previous embodiment. In the same manner, the flanges of the H-shaped members of a coil according to any of the other previous embodiments can be connected by conductive coupling.

Figure 10:
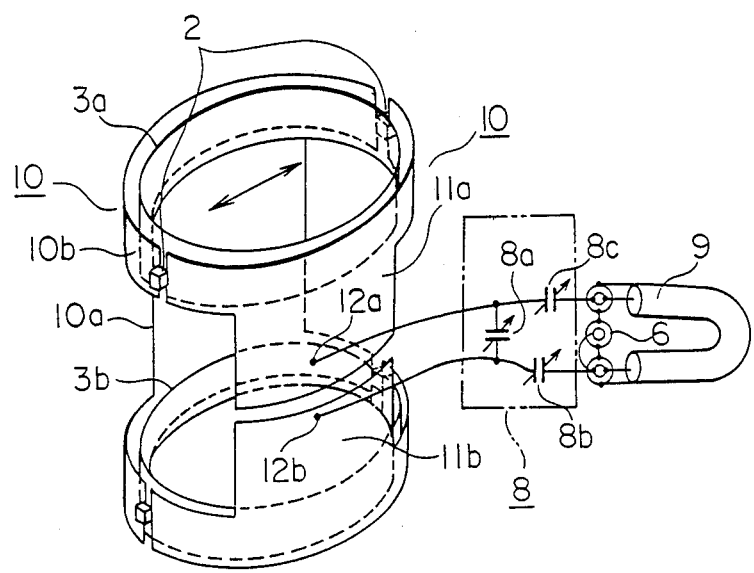
FIG. 10 is a schematic perspective view of a sixth embodiment of the present invention in which the tube formed by the H-shaped members has an elliptical transverse cross section, the webs of the H-shaped members being disposed at opposite ends of the minor axes.
Figure 11:
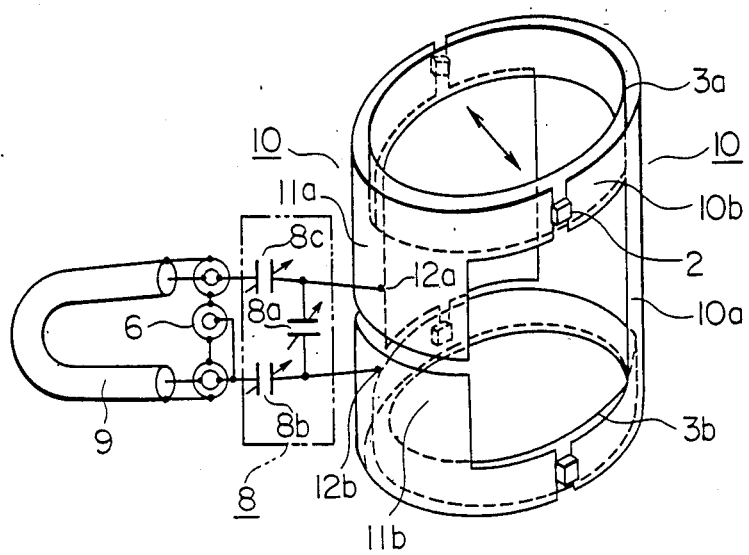
FIG. 11 is a schematic perspective view of a seventh embodiment of the present invention also having an elliptical transverse cross section, the webs of the H-shaped members being disposed at opposite ends of the major axes.

When a radio frequency coil is used in a whole body nuclear magnetic resonance imaging apparatus, due to the large dimensions of the coil, which must be large enough to surround any part of the human body, the efficiency of magnetic field generation and the signal-to-noise ratio of input signals decrease. It is possible to compensate for these decreases by bending the H-shaped members such that the tube formed thereby has an elliptical rather than a circular transverse cross section, which results in a higher magnetic field generating efficiency and signal-to-noise ratio. FIGS. 10 and 11 respectively illustrate a sixth and a seventh embodiment of the present invention which are designed to surround the human body. The H-shaped members 10 are curved so as to form a tube with an elliptical transverse cross section. The guard rings 3a and 3b likewise have an elliptical shape. The embodiment of FIG. 10 employs two H-shaped members 10 whose webs are disposed at opposite ends of the minor axes of transverse cross sections of the tube. Aside from the elliptical shape of the H-shaped members 10b and the guard rings 3a and 3b, the structure and operation are identical to that of the embodiment of FIG. 4. The arrow in the figure indicates the direction of the magnetic field which is produced within the tube. If the tube is disposed so that its longitudinal axis and the major axes of the transverse cross sections are horizontal, the direction of the magnetic field generated within the tube will be horizontal.

In contrast, in the embodiment of FIG. 11, the webs 10a of the H-shaped members 10 are disposed at opposite ends of the major axes of the transverse cross sections of the tube, so that the direction of the magnetic field within the tube, indicated by the arrow, will be vertical when the tube is placed so that its longitudinal axis and the major axis of the transverse cross sections are horizontal. The operation of these two embodiments is identical to that of the embodiment of FIG. 4. The efficiency of magnetic field generation and the signal-to-noise ratio of an elliptical radio frequency coil are significantly higher than for one with a circular transverse cross section. It has been experimentally determined that at a resonant frequency of 64 MHz, with the same electrical power consumption, the magnetic field strength is 60–70% higher for a coil with an elliptical transverse cross section than for one with a circular transverse cross section.

Figure 12:
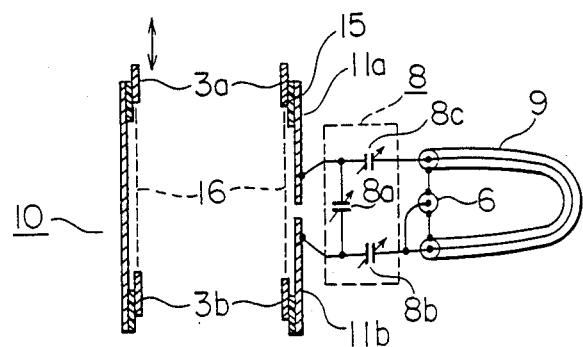
FIG. 12 is a schematic cross-sectional view of an eighth embodiment of the present invention in which the guard rings are connected by a link and can be moved in the longitudinal direction of the tube.

In each of the previous embodiments, the guard rings 3a and 3b remain stationary with respect to the H-shaped members. FIG. 12 is a schematic cross-sectional view of an eighth embodiment of the present invention in which a pair of guard rings 3a and 3b are suported by unillustrated means so as to be movable in the longitudinal direction of the coil. The guard rings are electrically insulated from the H-shaped members 10 by a dielectric material 15 which is secured to the inner surface of the flanges 10b of the H-shaped members 10 and is in sliding contact with the inner surfaces of the guard rings, although the dielectric material 15 may instead be secured to the guard rings and slide against the flanges 10b. The upper guard ring 3a and the lower guard ring 3b are rigidly connected with one another by an electrically insulating link 16 which enables the guard rings to be moved as a single unit. The structure of this embodiment is otherwise identical to that of the embodiment of FIG. 4. By moving the guard rings up and down, the amount of overlap between the guard rings and the flanges 10b is varied, thus changing the capacitance and the resonant frequency of the coil.

In the embodiments of FIGS. 4 and 8–12, only one of the H-shaped members 10 of each pair of H-shaped members 10 is divided into two T-shaped plates. However, it is also possible to divide both H-shaped members 10 of each pair into two T-shaped plates and to connect the legs of the T-shaped plates of the other H-shaped member 10 by a fixed or variable capacitor, as a result of which the frequency range of the coil can be increased.

Also, in the embodiments other than that of FIG. 5, a single variable capacitor 8a is used as a variable capacitor means for adjusting the capacitance of the coil, but it is also possible to place a fixed capacitor in parallel with the variable capacitor 8a across the feeding points of the coil.

It is desirable to surround the H-shaped members of a coil according to the present invention with an electromagnetic shield in the form of an electrically conducting cylinder which is coaxial with respect to the coil. Such an electromagnetic shield decreased losses in the equivalent resonant circuit formed by the coil and increases the spatial uniformity of the high frequency magnetic field which is generated within the coil.

In each of the previous embodiments, electrically conducting guard rings 3a and 3b are employed, but these rings are not essential to the operation of the coil and are therefore optional.

If the flanges of adjacent H-shaped members are connected by capacitive coupling, instead of using fixed capacitors such as the chip capacitors 2, it is also possible to use variable capacitors.

In the previous embodiments, a half-wavelength coaxial cable 9 is employed as a balanced-to-unbalanced converter, but other suitable means can instead be employed such as a transformer with a well-balanced secondary or a Sperrtopf circuit.

What is claimed is:

1. A radio frequency coil system for a nuclear magnetic resonance imaging apparatus, comprising:
   one or more pairs of plate-like, electrically conducting H-shaped members, each of said H-shaped members having a longitudinally-extending web and two flanges at opposite ends of and perpendicular to said web, each of said H-shaped members being bent into the shape of an arc and being symmetrically disposed about a common axis so as to form a tube, each of said webs being parallel to said axis, said flanges extending circumferentially around said tube towards one another, each flange being electrically connected to a flange of the adjacent H-shaped member; and
   balanced feeding means for feeding balanced currents to said H-shaped members wherein said balance feeding means includes a balanced impedance matching circuit having a first, a second and a third variable capacitance means wherein said third variable capacitance means provides for the adjustment of the resonant frequency of said coil and wherein said third variable capacitor is connected between one end of each of said first and second variable capacitors, said balanced feeding means further including a balanced-to-unbalanced converter connected between the ends of said first and second variable capacitors which are not connected to said third variable capacitor means.

2. A radio frequency coil as claimed in claim 1, wherein said balanced-to-unbalanced converter is a half-wavelength coaxial cable.

3. A radio frequency coil as claimed in claim 1, wherein said balanced-to-unbalanced converter is a Sperrtopf circuit.

4. A radio frequency coil as claimed in claim 1, wherein said balanced-to-unbalanced converter is a transformer.

5. A radio frequency coil as claimed in claim 1, wherein said variable capacitor means is a variable capacitor which is connected between two flanges of adjacent H-shaped members.

6. A radio frequency coil as claimed in claim 1, wherein:
   at least one of the H-shaped members of each pair of H-shaped members is transversely divided in two at the midportion of its web so as to form two T-shaped plates;
   said variable capacitor means is a variable capacitor which is connected between the legs of said T-shaped plates.

7. A radio frequency coil as claimed in claim 1, wherein:
   each of said H-shaped members is divided transversely in two at the midportion of its web so as to form two T-shaped plates, whereby said coil is divided transversely into two halves;
   the legs of the two T-shaped plates of each H-shaped member overlap in the longitudinal direction of said coil;
   the two halves of said coil are supported such that at least one half can be moved with respect to the other half in the longitudinal direction of said coil so as to vary the area of the overlapping portions; and
   said adjustable capacitor means comprises the overlapping portions of said legs of said T-shaped plates and a dielectric material which is disposed between the two legs of the two T-shaped plates of each H-shaped member in the overlapping portions, said dielectric material being secured to the legs of the T-shaped plates of only one half of said coil and being in sliding contact with the legs of the T-shaped plates of the other half of said coil.

8. A radio frequency coil as claimed in claim 7, wherein said dielectric material is selected from the group consisting of synthetic resins and porcelain.

9. A radio frequency coil as claimed in claim 7, wherein the other H-shaped member of each pair of H-shaped members is divided in two at the midportion of its web to form two T-shaped plates, and the legs of said two T-shaped plates of said other H-shaped member are electrically connected by capacitive coupling.

10. A radio frequency coil as claimed in claim 1, wherein the flanges of adjacent H-shaped members are connected by capacitive coupling.

11. A radio frequency coil as claimed in claim 1, wherein the flanges of adjacent H-shaped members are connected by conductive coupling.

12. A radio frequency coil as claimed in claim 11, wherein the flanges of adjacent H-shaped members are connected by pressure welding.

13. A radio frequency coil as claimed in claim 11, wherein the flanges of adjacent H-shaped members are connected by soldering.

14. A radio frequency coil as claimed in claim 11, wherein the flanges of adjacent H-shaped members are connected by electrical conductors.

15. A radio frequency coil as claimed in claim 1, wherein the transverse cross-sectional shape of said coil is circular.

16. A radio frequency coil as claimed in claim 1, wherein the transverse cross-sectional shape of said tube is elliptical.

17. A radio frequency coil as claimed in claim 16, wherein said tube comprises one pair of said H-shaped members which are disposed such that their webs are at opposite ends of the major axes of the transverse cross sections of said tube.

18. A radio frequency coil as claimed in claim 16, wherein said tube comprises one pair of said H-shaped members which are disposed such that their webs are at opposite ends of the minor axes of the transverse cross sections of said tube.

19. A radio frequency coil as claimed in claim 1, further comprising an electromagnetic shield which surrounds said H-shaped members and is coaxial with respect to said coil.

20. A radio frequency coil as claimed in claim 1, further comprising two electrically conducting guard rings which are coaxially disposed in said tube at opposite ends thereof within said flanges, said guard rings being electrically insulated from said tube, at least one of said guard rings being grounded.

21. A radio frequency coil as claimed in claim 20, further comprising an electrically-insulating link which rigidly connects said guard rings, said guard rings being supported such that they can be moved in the longitudinal direction of said tube as a single unit.

* * * * *